(12) United States Patent
McMillin et al.

(10) Patent No.: US 6,270,862 B1
(45) Date of Patent: *Aug. 7, 2001

(54) METHOD FOR HIGH DENSITY PLASMA CHEMICAL VAPOR DEPOSITION OF DIELECTRIC FILMS

(75) Inventors: Brian McMillin, Fremont; Huong Nguyen, Danville; Michael Barnes, San Francisco; Butch Berney, San Jose, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/359,639

(22) Filed: Jul. 26, 1999

Related U.S. Application Data

(63) Continuation of application No. 08/672,315, filed on Jun. 28, 1996, now abandoned.

(51) Int. Cl.[7] ....................................... H05H 1/24
(52) U.S. Cl. .................................. 427/569; 438/758
(58) Field of Search ................................ 427/569, 574, 427/578, 579; 438/758, 767, 787, 788

(56) References Cited

U.S. PATENT DOCUMENTS

| 4,173,661 | 11/1979 | Bourdon ................................. 427/39 |
| 4,270,999 | 6/1981 | Hassan et al. . |

(List continued on next page.)

FOREIGN PATENT DOCUMENTS

| 0520519 A1 | 12/1992 | (EP) . |
| 0637058 A1 | 2/1995 | (EP) . |
| 0641013 A2 | 3/1995 | (EP) . |
| 0674336 A1 | 9/1995 | (EP) . |
| 0676790 A1 | 10/1995 | (EP) . |
| 0709875 A1 | 5/1996 | (EP) . |

Primary Examiner—Gregory Mills
Assistant Examiner—Luz L. Alejandro
(74) Attorney, Agent, or Firm—Burns, Doane, Swecker & Mathis, LLP

OTHER PUBLICATIONS

"Preparation of SiOF Films with Low Dielectric Constant by ECR Plasma Chemical Vapor Deposition", by T. Fukada et al., *Extended Abstracts of the 1995 International Conference on Solid State Devices and Materials*, (1993), pp. 158–160.
"New approach to low temperature deposition of high–quality thin films by electron cyclotron resonance microwave plasmas", by T.T. Chau et al., *J. Vac. Sci. Technol. B.*, vol. 10(5) (Sep/Oct. 1992), pp. 2170–2178.

(57) ABSTRACT

A plasma processing system for processes such as chemical vapor deposition includes a plasma processing chamber, a substrate holder for supporting a substrate within the processing chamber, a dielectric member having an interior surface facing the substrate holder, the dielectric member forming a wall of the processing chamber a gas supply for supplying gas to the chamber, directed towards the substrate, and an RF energy source such as a planar coil which inductively couples RF energy through the dielectric member and into the chamber to energize the process gas into a plasma state. The gas supply may comprise a primary gas ring and a secondary gas ring for supplying gases or gas mixtures into the chamber. The gas supply may further include injectors attached to the primary gas ring which inject gas into the chamber, directed toward the substrate. The plasma processing system may also include a cooling mechanism for cooling the primary gas ring during processing.

25 Claims, 8 Drawing Sheets

U.S. PATENT DOCUMENTS

| | | |
|---|---|---|
| 4,512,283 | 4/1985 | Bonifield et al. . |
| 4,579,618 | 4/1986 | Celestino et al. . |
| 4,614,639 | 9/1986 | Hegedus . |
| 4,691,662 | 9/1987 | Roppel et al. . |
| 4,806,321 | 2/1989 | Nishizawa et al. . |
| 4,854,263 | 8/1989 | Chang et al. . |
| 4,877,641 | 10/1989 | Dory . |
| 4,913,929 | 4/1990 | Moslehi et al. . |
| 4,919,745 | 4/1990 | Fukuta et al. ................... 156/345 |
| 4,943,345 | 7/1990 | Asmussen et al. . |
| 4,948,458 | 8/1990 | Ogle ............................. 156/643 |
| 4,980,204 | 12/1990 | Fujii et al. . |
| 4,992,301 | 2/1991 | Shishiguchi et al. . |
| 4,996,077 | 2/1991 | Moslehi et al. . |
| 5,105,761 | 4/1992 | Charlet et al. . |
| 5,134,965 | 8/1992 | Tokuda et al. . |
| 5,164,040 | 11/1992 | Eres et al. . |
| 5,169,509 | 12/1992 | Latz et al. . |
| 5,192,370 | 3/1993 | Oda et al. . |
| 5,231,334 | 7/1993 | Paranjpe . |
| 5,252,133 | 10/1993 | Miyazaki et al. . |
| 5,262,029 | 11/1993 | Erskine et al. . |
| 5,267,607 | 12/1993 | Wada . |
| 5,279,865 | 1/1994 | Chebi et al. . |
| 5,280,154 | 1/1994 | Cuomo et al. . |
| 5,346,578 | 9/1994 | Benzing et al. . |
| 5,368,710 | 11/1994 | Chen et al. . |
| 5,384,008 | 1/1995 | Sinha et al. . |
| 5,399,387 | 3/1995 | Law et al. . |
| 5,401,350 | 3/1995 | Patrick et al. . |
| 5,405,480 | 4/1995 | Benzing et al. . |
| 5,415,728 | 5/1995 | Hasegawa et al. . |
| 5,498,313 | 3/1996 | Bailey et al. . |
| 5,522,934 | 6/1996 | Suzuki et al. . |
| 5,522,936 | 6/1996 | Tamura ........................ 118/723 R |
| 5,525,159 | 6/1996 | Hama et al. .................. 118/723 I |
| 5,529,657 | 6/1996 | Ishii . |
| 5,531,834 | 7/1996 | Ishizuka et al. . |
| 5,552,124 | 9/1996 | Su . |
| 5,556,521 | 9/1996 | Ghanbari ..................... 204/192.32 |
| 5,587,038 * | 12/1996 | Cecchi et al. ................ 156/345 |
| 5,614,055 | 3/1997 | Fairbairn et al. ............. 156/345 |
| 5,653,806 | 8/1997 | VanBuskirk .................. 118/715 |
| 5,792,269 | 8/1998 | Deacon et al. . |
| 5,851,294 | 12/1998 | Young et al. . |
| 6,013,155 * | 1/2000 | McMillin et al. ............. 156/345 |

OTHER PUBLICATIONS

"Silicon dioxide trench filling process in a radio-frequency hollow cathode reactor", by M. Gross et al., *J. Vac. Sci. Technol. B.*, vol. 11(2), (Mar./Apr. 1993), pp. 242–248.

"Biased Electron Cyclotron Resonance Chemical–Vapor Deposition of Silicon Dioxide Inter–Metal Dielectric Thin Films", by P. Shufflebotham et al., *Materials Science Forum*, Switzerland, vol. 140–142, (1993) pp. 255–268.

"Preparation of SiOF Films with Low Dielectric Constant by ECR Plasma Chemical Vapor Deposition", by T. Fukada et al., *Extended Abst. of the 1993 Intern. Conf. on Solid State Devices and Materials*, (Feb. 21–22, 1995), pp. 43–49.

"High Density Plasma Deposition and Deep Submicron Gap Fill with Low Dielectric Constant SiOF Films", by L.Q. Qian et al., *DUMIC Conference*, (Feb. 21–22, 1995), 1995 ISMIC—101D/95/0050, pp. 50–56.

"Dual Frequence Plasma CVD Fluorosilicate Glass Water Absorption and Stability", by M.J. Shapiro et al. *DUMIC Conference*, (Feb. 21–22, 1995), 1995 ISMIC—101D/95/118, pp. 118–123.

"Comparison of PECVD F–TEOS Films and High Density Plasma SiOF Films", by D. Carl et al., *VMIC Conference*, (Jun. 27–29, 1995), 1995 ISMIC—104/95/0097, pp. 97–103.

"Water–absorption mechanisms of F–doped PECVD $SiO_2$ with low–dielectric constant", by H. Miyajima et al., *VMIC Conference*, (Jun. 27–29, 1995), 1995 ISMIC—104/95/0391, pp. 391–393.

"Controlling Fluorine Concentration and Thermal Annealing Effect on Liquid–Phase Deposited $SiO_{2-x}F_x$ Films", by C.F. Yeh, *J. of Electrochem. Soc.*, vol. 142, No. 10 (Oct. 1995), pp. 3579–3583.

"An Evaluation of Fluorine Doped Peteos on Gap Fill Ability and Film Characterization", by K. Hewes et al., Texas Instruments, Dallas, Texas, DUMIC Conference, Feb. 21–22, 1995, 5 pages.

"Fundamentals, Etching, Deposition, and Surface Interactions", by Stephen M. Rossnagel et al., *Handbook of Plasma Processing Technology*, (1989), pp. DUMIC Conference Feb. 21–22, 1995, 5 pages.

"Electron cyclotron resonance microwave discharges for etching and thin–film deposition", by Jes Asmussen, *J. Vac. Sci. Technol. A.*, vol. 7, No. 3, (May/Jun. 1989), pp. 883–893.

"Silicon Dioxide Films Produced by PECVD of TEOS and TMCTS", by D. Webb et al., 10439 Proceedings of the Int. Symp. on Ultra Large Scale Integration Science and Technology, (1989); No. 9, Pennington, NJ, pp. 571–585.

"Low–temperature deposition of silicon dioxide films from electron cyclotron resonant microwave plasmas", by T.V. Herak et al., *J. Appl. Phys.*, 65(6), (Mar. 15, 1989), pp. 2457–2463.

"Reactive ion etching technology in thin–film–transistor processing", by Y. Kuo, *IBM J. Res. Develop.*, vol. 36, No. 1, (Jan. 1992), pp. 69–75.

* cited by examiner

FIG. 10b          FIG. 10c

METHOD FOR HIGH DENSITY PLASMA CHEMICAL VAPOR DEPOSITION OF DIELECTRIC FILMS

This application is a continuation of application Ser. No. 08/672,315, filed Jun. 28, 1996 now abandoned.

FIELD OF THE INVENTION

The present invention relates to a system and a method for delivering reactants to a substrate in a high density plasma chemical vapor deposition reactor. More particularly, the present invention relates to a system and a method for focusing the delivery of reactants via a gas injection system towards a substrate during processing of the substrate in a high density plasma chemical vapor deposition reactor and thermally controlling the gas injection hardware.

BACKGROUND OF THE INVENTION

Vacuum processing chambers are generally used for chemical vapor depositing (CVD) of materials on substrates by supplying process gas to the vacuum chamber and applying an RF field to the gas. A number of gas distribution systems for integrated circuit processing are known, but the vast majority of known systems are designed for plasma etching or for plasma enhanced CVD (PECVD). Conventional gas distribution systems typically deliver reactants at relatively low flow rates. Showerhead gas injection and diffusive transport systems are commonly used to ensure even distribution over the substrate.

These known systems are not optimized for high density plasma CVD (HDPCVD) processes, such as encapsulation and intermetal dielectric gas filling. In HDPCVD it is important to focus the delivery of reactants such as silane related species onto a substrate, because silane and its radicals, e.g., $SiH_3$, $SiH_2$, SiH, and so on, have high sticking coefficients. Directing the silane preferentially onto the substrate is advantageous because it maximizes the substrate deposition rate and minimizes film deposits on various internal surfaces of the reactor.

Efficient silane utilization in HDPCVD requires the reactant gas to be directed onto the substrate from close proximity, with a high flow rate, and even distribution, to achieve high deposition rates with good uniformity and film quality. A showerhead system positioned close to the substrate is not ideal because it limits the extent of ion diffusion within the plasma which can be detrimental to plasma and deposition uniformity. Diffusive systems are not adequate for HDPCVD because they cause deposition of reactants on surfaces other than the substrate being processed. Deposition on non-substrate surfaces results in an inefficient use of the reactant gases, which necessitates higher flow rates to reach the desired deposition rate and substrate throughput. These higher flow rates are costly because of both the additional gas used and the increased pumping capacity necessary for maintaining low pressure within the processing chamber. Furthermore, deposition on non-substrate surfaces within the chamber can lead to particulate problems (flaking) caused by differential expansion between the films and chamber interior surfaces, and process shifts due to changing wall conditions. Consequently, the chamber must be cleared more often to remove these chamber deposits, which further reduce substrate throughput.

A plasma etching system has been proposed in which gas inlets supply gas into a plasma processing chamber. As shown in FIG. 1, this system includes a plasma source 110 for generating a plasma in a chamber 140 and a gas ring 167 with attached gas inlets supplying process gas into the processing chamber 140 for processing a substrate 120 on a substrate support 130. This type of system may also include an additional gas ring 160. Conventionally, the deposition rate in such a system is increased by concentrating the process gas above the substrate 120. This is typically done by changing the distance from the gas ring 167 to the substrate 120. The more the process gas is concentrated toward the area above the center of the substrate, the larger the peak deposition rate. Unfortunately, in concentrating the process gas near the center of the substrate, the deposition rate on the outer portion of the substrate may not increase as much as the center, which leads to a potential decrease in deposition uniformity.

There is thus a need for a gas distribution system which is optimized for HDPCVD and which provides both an improved deposition rate and an improved deposition uniformity.

SUMMARY OF THE INVENTION

It is an object of the present invention to provide gas distribution system for HDPCVD which provides uniform, high flow rate delivery of reactant gases focused preferentially onto the substrate surface, to both maximize deposition rate on the substrate and to minimize the chamber cleaning requirements. It is another object of the present invention to thermally control the gas injection hardware to reduce particle counts within the chamber by minimizing flaking from internal chamber surfaces and by minimizing particle formation caused by thermal pyrolysis within the injection hardware. It is yet another object of the present invention to improve the deposition rate and uniformity of deposition compared to conventional gas distribution systems.

According to one aspect of the invention, a plasma processing system is provided for processing a substrate. The plasma processing system includes a plasma processing chamber, a substrate holder for supporting a substrate within the processing chamber, a dielectric member forming a wall of the processing chamber, a gas supply for supplying process gas (e.g., one or more reactant gases and/or one or more inert gases) into the chamber and towards the substrate, and an RF energy source which inductively couples RF energy through the dielectric member and into the chamber to energize the process gas into a plasma state. The gas supply may include one or more gas rings with or without injectors injecting at least some of the process gas into the processing chamber so as to intersect an exposed surface of the substrate. A cooling mechanism may also be provided to cool the gas supply during processing to minimize film flaking from the gas ring surfaces and prevent excessive heating which could lead to unwanted thermal decomposition of the process gas.

According to another aspect of the present invention, a method is provided for processing a substrate. The method includes placing a substrate on a substrate holder in a processing chamber, an interior surface of a dielectric member forming a wall of the process chamber and facing the substrate holder, supplying process gas into the processing chamber, and energizing the dielectric member into the processing chamber. Substrates may be consecutively processed in the processing chamber by contacting the substrate with plasma gas. The process gas may be injected into the processing chamber such that at least some of the process gas is directed towards the substrate. In addition, the gas supply hardware may be cooled during processing to minimize flaking and preventing excessive heating.

BRIEF DESCRIPTION OF THE DRAWINGS

FIGS. 9a–9c and 10a–10c illustrate detailed views of exemplary injectors and gas rings according to the present invention.

DETAILED DESCRIPTION OF THE PREFERRED EMBODIMENTS

Figure 1:
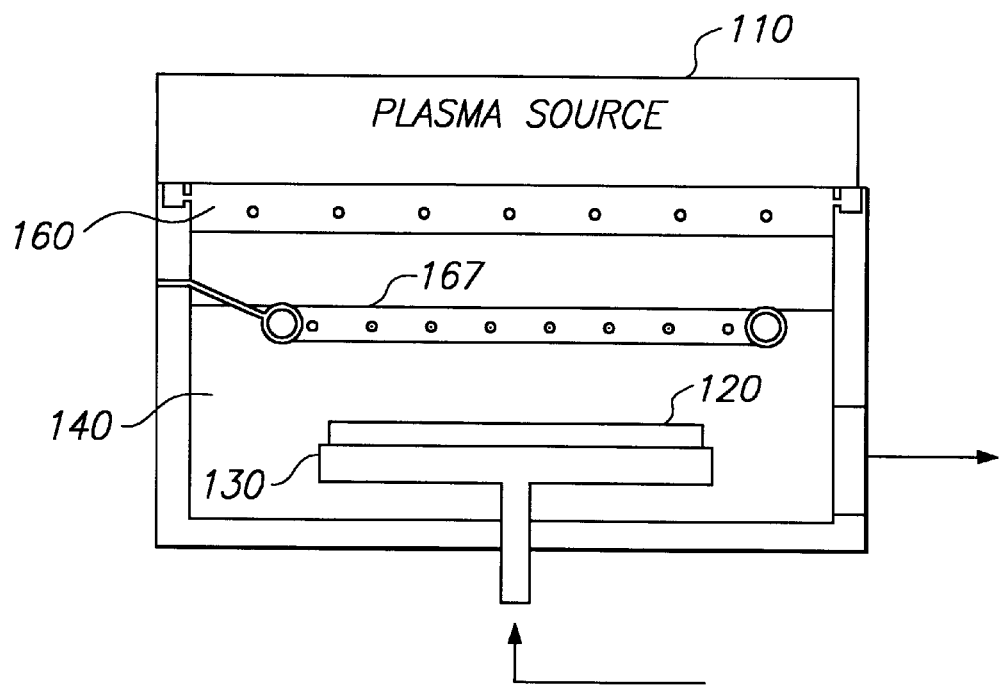
FIG. 1 illustrates a conventional plasma processing system.
Figure 2A:
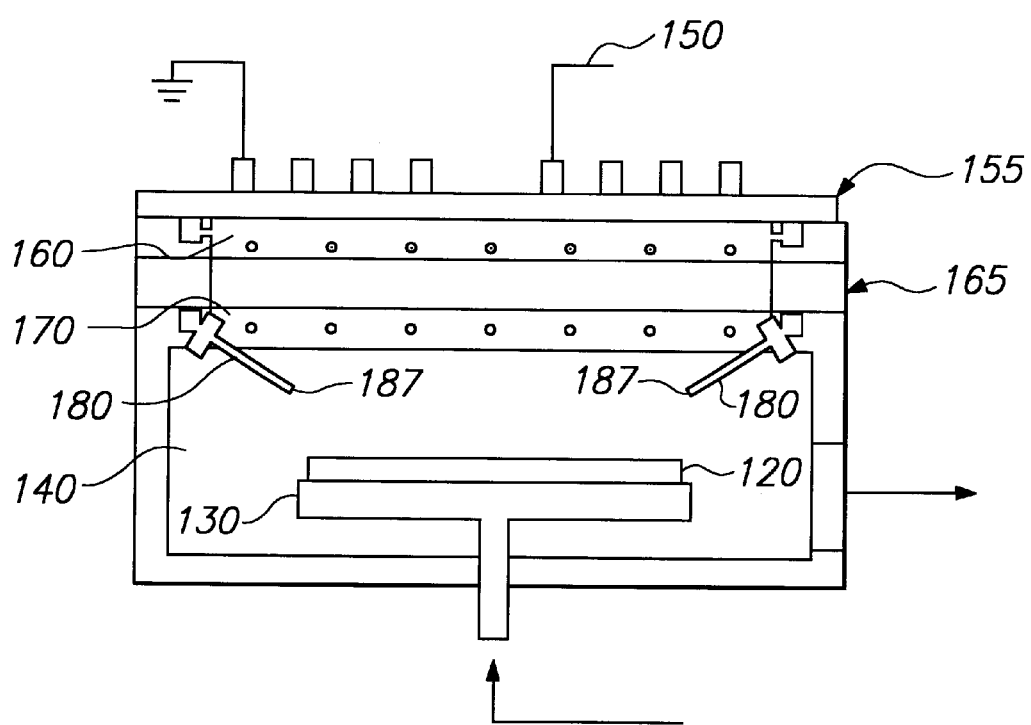
FIGS. 2a and 2b illustrate a plasma processing system according to a first embodiment of the present invention.
Figure 2B:
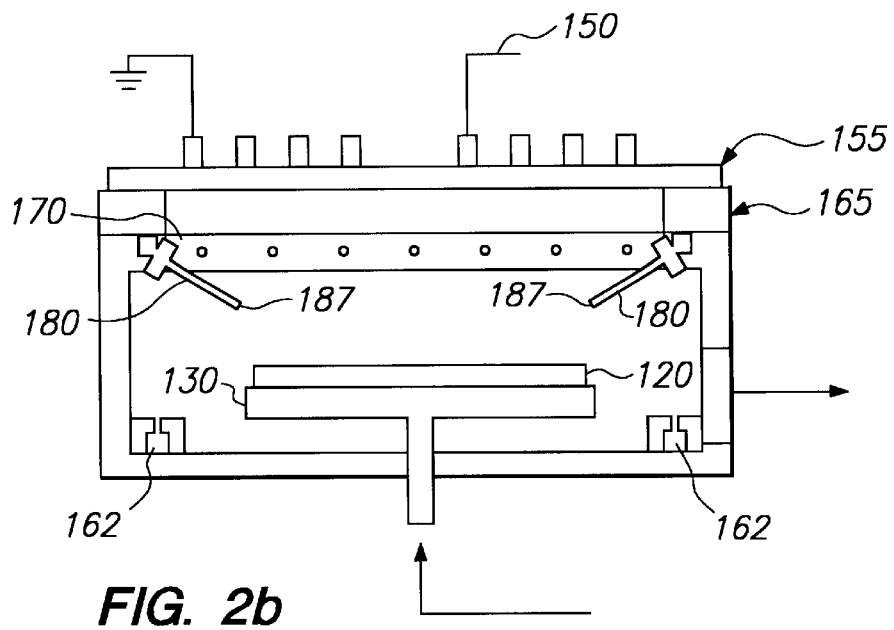
Figure 4:
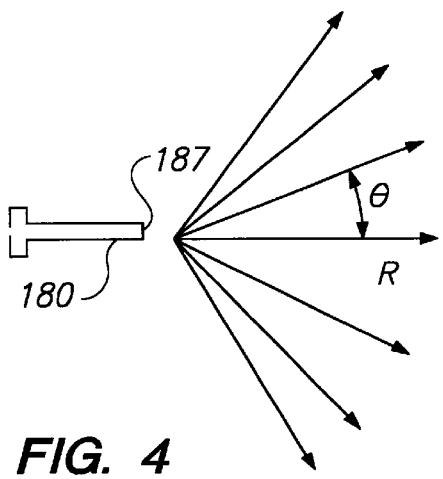
FIG. 4 illustrates exemplary flow streamlines of gas into the plasma processing system according to the present invention.
Figure 5:
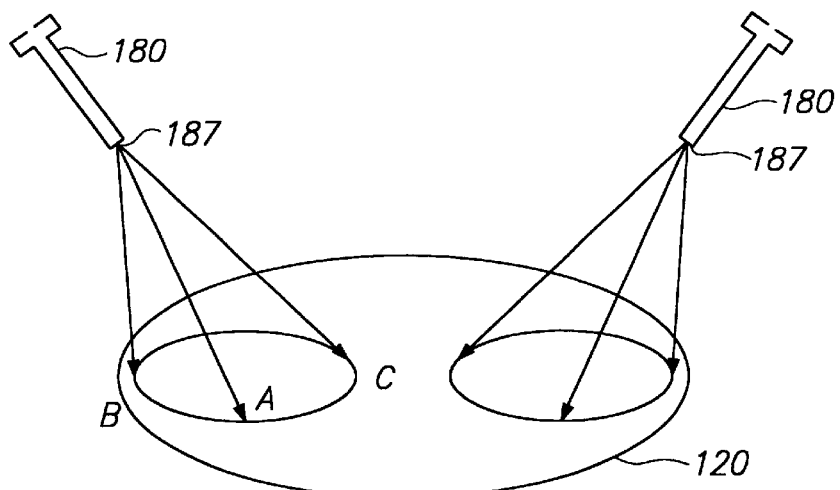
FIG. 5 illustrates qualitatively exemplary directions of a gas directed onto a substrate according to the present invention.

FIGS. 2a and 2b illustrate a plasma processing system according to a first embodiment of the present invention. Referring to FIGS. 2a and 2b, a plasma processing system for processing a substrate 120 comprises a substrate support 130 and a processing chamber 140 enclosing the substrate support. The substrate 120 may be, for example, a semiconductor wafer having diameters such as 4", 6", 8", 12", etc., a glass substrate for making a flat panel display, and so on. The substrate support 130 may comprise, for example, a radio frequency (RF) biased electrode. The substrate support 130 may be supported from a lower endwall of the chamber 140 or may be cantilevered, extending from a sidewall of the chamber 140. The substrate 120 may be clamped to the electrode 130 either mechanically or electrostatically. The processing chamber 140 may, for example, be a vacuum cleaner.

A substrate to be processed is inserted into the processing chamber 140. The substrate is processed in the processing chamber by energizing a process gas in the processing chamber into a high density plasma. A source of energy maintains a high density (e.g., $10^{11}$–$10^{12}$ ions/cm$^3$) plasma in the chamber. For example, an antenna 150, such as the planar multiturn coil shown in FIGS. 2a and 2b, a non-planar multiturn coil, or an antenna having another shape, powered by a suitable RF source and suitable RF impedance matching circuitry inductively couples RF energy into the chamber to provide a high density plasma. However, the plasma can be generated by other sources such as ECR, parallel plate, helicon, helical resonator, etc., type sources. The chamber may include a suitable vacuum pumping apparatus for maintaining the interior of the chamber at a desired pressure (e.g., below 5 Torr, preferably 1–100 mTorr). A dielectric window, such as the planar dielectric window 155 of uniform thickness shown in FIGS. 2a and 2b or a non-planar dielectric window, is provided between the antenna 150 and the interior of the processing chamber 140 and forms the vacuum wall at the top of the processing chamber 140.

A gas supply supplying process gas into the chamber includes a primary gas ring 170 below the dielectric window 155. The gas ring 170 may be mechanically attached to the chamber housing above the substrate. The gas ring 170 may be made of, for example, aluminum or anodized aluminum.

The gas supply includes a secondary gas ring 160 below the dielectric window 155. The process gas can include one or more gases such as Ar and $O_2$ delivered into the chamber 140 through orifices in the secondary gas ring 160. Any suitable gas ring may be used as the secondary gas ring 160. The secondary gas ring 160 may be located above the gas ring 170, separated therefrom by an optional spacer 165 formed of aluminum or anodized aluminum, as shown in FIG. 2a. Alternatively, although not shown, the secondary gas ring 160 may be located below the gas ring 170, between the gas ring 170 and the substrate 120. Yet another alternative is that the Ar and $O_2$ may be supplied through orifices in a gas ring 162 connected to the chamber floor, as shown in FIG. 2b, with the spacer 165 separating the dielectric window 155 and the primary gas ring 170.

The gas supply can further include a plurality of detachable injectors 180 connected to the primary gas ring 170 to direct at least some of a process gas such as $SiH_4$ or a related silicon-containing gas such as $SiF_4$, TEOS, and so on, onto the substrate 120. These gases are delivered to the substrate from the injectors 180 through injector exit orifices 187. Additionally, reactant gases may be delivered through orifices in the primary gas ring 170. The injectors may be made of any suitable material such as aluminum, anodized aluminum, quartz or ceramics such as $Al_2O_3$. Although two injectors are shown in FIGS. 2a and 2b, any number of injectors may be used. For example, an injector may be connected to each of the orifices on the primary gas ring 170. Preferably, eight to thirty-two injectors are employed on a 200 to 210 mm diameter ring 170 for a 200 mm substrate.

The injectors 180 are located above the plane of the substrate 120, with their orifices at any suitable distance such as, for example, three to ten centimeters from the substrate. The injectors may, according to a preferred embodiment, be spaced inside, near or outside of the substrate periphery, for example zero to five centimeters from the substrate periphery. This helps to ensure that any potential particle flakes from the injectors will not fall onto the substrate and contaminate it. The injectors may all be the same length or alternatively a combination of different lengths can be used to enhance the deposition rate and uniformity. The injectors are oriented such that at least one of the injectors direct the process gas in a direction which intersects the exposed surface of the substrate.

Figure 11:
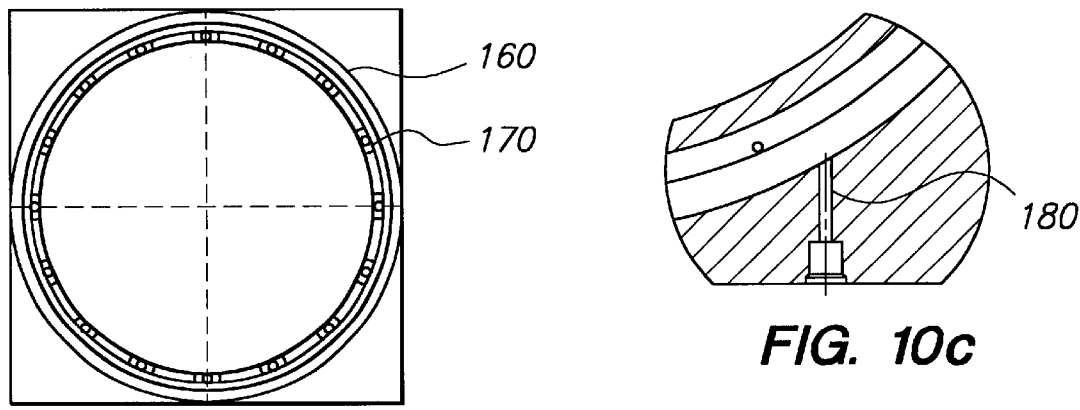
FIG. 11 illustrates a detailed view of an exemplary injector according to the present invention.
Figure 11:
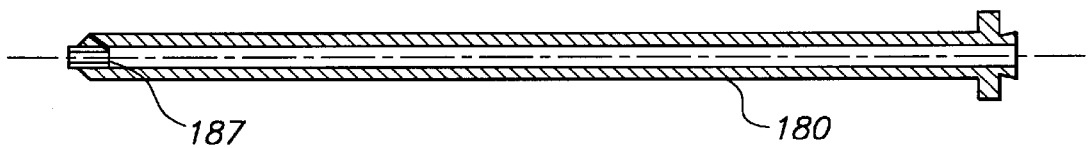

As opposed to previous gas injection systems designs which rely predominantly on diffusion to distribute process gas above the substrate, the injectors according to one embodiment of the present invention are oriented to inject process gas in a direction which intersects an exposed surface of the substrate at an acute angle. The angle or axis of injection may range from about 15 to <90 degrees, preferably 15 to 45 degrees from the horizontal plane of the substrate. The angle or axis of injection may be along the axis of the injector or, alternatively, at an angle of up to 90 degrees with respect to the axis of the injector, as shown in FIG. 11. The exit orifice diameter of the injectors may be between 0.010 and 0.060 inches, preferably about 0.020 to 0.040 inches. The hollow core of the injectors 180 may be drilled to about twice the diameter of the exit orifice 187 to ensure that sonic flow occurs at the exit orifice and not within the core of the injector. The flow rate of $SiH_4$ is preferably between 25–300 sccm for a 200 mm substrate but could be higher for large substrates.

Due to the small orifice size and number of injectors and large flowrates of $SiH_4$, a large pressure differential develops between the gas ring 170 and the chamber interior. For example, with the gas ring at a pressure of >1 Torr, and the chamber interior at a pressure of about 10 mTorr, the pressure differential is about 100:1. This results in choked, sonic flow at the orifices of the injectors. The interior orifice of the injector may also be contoured to provide supersonic flow at the outlet.

Injecting the $SiH_4$ at some velocity inhibits the plasma from penetrating the injectors. This design prevents plasma-induced decomposition of the $SiH_4$ and the subsequent formation of amorphous silicon residues within the gas ring and injector extension tubes.

According to this embodiment, a combination of convective and radiative cooling may be used to limit the chamber wall and gas ring temperatures to preferably less than about 100° C. during processing. Alternatively, circulating fluid, preferably at −20 to 100° C., within the chamber walls may be used to control the wall and gas ring temperatures. Because the gas ring temperature is typically maintained below 100° C., no thermal decomposition of $SiH_4$ is observed within the gas ring. In addition, because the gas ring is effectively an electrically grounded, enclosed metal chamber, no significant electric fields are present within the gas ring, which prevents plasma formation within the ring.

The plasma processing system according to this embodiment provides an increased deposition rate and improved uniformity on the substrate, compared to conventional gas distribution systems, by concentrating the silicon-containing process gas above the substrate and by preferentially directing the process gas onto specific regions of the substrate. The following discussion describes experimental data which illustrate the improved capability of the plasma processing system according to the present invention and also briefly describes the relevant theoretical background.

Figure 3A:
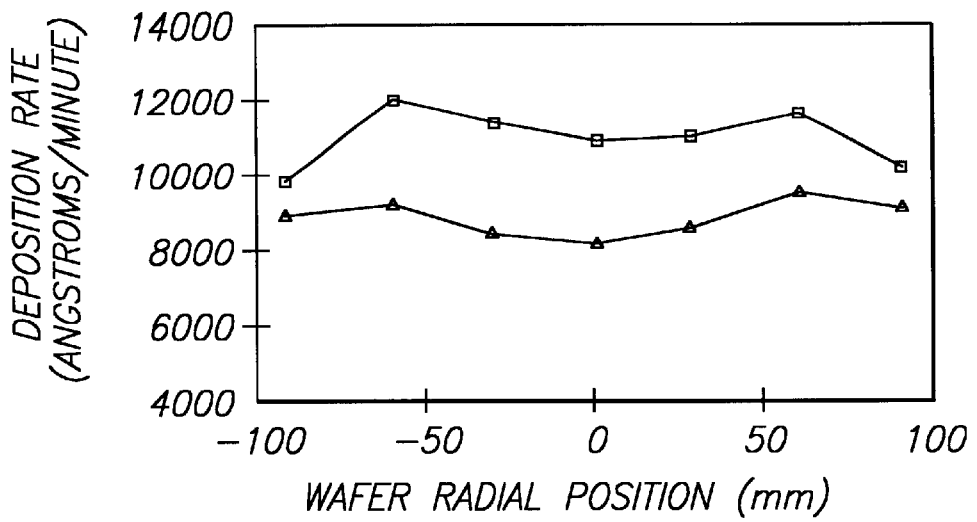
FIGS. 3a and 3b show experimental data illustrating the effects of varying the radial location of injectors and the direction of injection, respectively, in the plasma processing system illustrated in FIGS. 2a and 2b.

FIG. 3a illustrates two examples $SiO_2$ deposition profiles for a plasma processing system in which the gas injectors are located at different positions with respect to the substrate. Both of these cases were obtained at the same deposition conditions (plasma source power=2000 Watts, electrode bias power=2000 Watts, $SiH_4$ flow=180 sccm, $O_2$ flow=300 sccm, pressure=12 mTorr, 22.5 degrees downward injection angle with respect to the substrate plane) with a non-optimized primary gas ring 170. Case 1 (open boxes) shows experimental data where the (16 circumferential, equally spaced) injector 180 orifices were located about 0.5 cm outside of the substrate periphery, while case 2 (open triangles) shows experimental data where the injector orifices 187 were located about 2 centimeters outside of the substrate periphery. In both of these examples, the injector orifices 187 were located about 5 centimeters above the substrate 120. (Generally speaking, in the plasma processing system according to the present invention, as long as the vertical location of the injector orifices 187 is a few centimeters or more above the substrate 120, the radial location of the injector orifices has a much larger impact on the deposition rate than does the vertical location.)

In case 1, the overall deposition rate is higher, that is 10800 Angstroms/minute compared to 9200 Angstroms/minute for case 2. This is because in case 1, the silicon containing process gas is more concentrated over the center of the substrate. However, this increased deposition rate for case 1 compared to 4.1% for case 2. By concentrating more of the silicon containing process gas onto and above the center of the substrate, the deposition rate on the outer (radial) region of the substrate is not increased in the same proportion as the deposition rate in the center. On the other hand, by positioning the injector orifice 187 further outward, the overall deposition rate is reduced, but the uniformity is improved. Hence, for a constant angle of injection (in this case 22.5 degrees) with respect to the substrate, there is a trade-off between deposition rate and uniformity, which occurs as the radial position of the injection point is varied.

The direction of injection from the gas ring 170 can, however, be optimized for each injector, so as to preferentially direct the process gas onto specific regions of the substrate. For example, in optimizing gas ring 170 for case 1, the angle of injection could be adjusted to preferentially direct more silicon-containing gas onto the substrate surface just inside of the substrate periphery. This would lead to an increase in the local deposition rate on the substrate and thereby improve the uniformity.

Figure 3B:
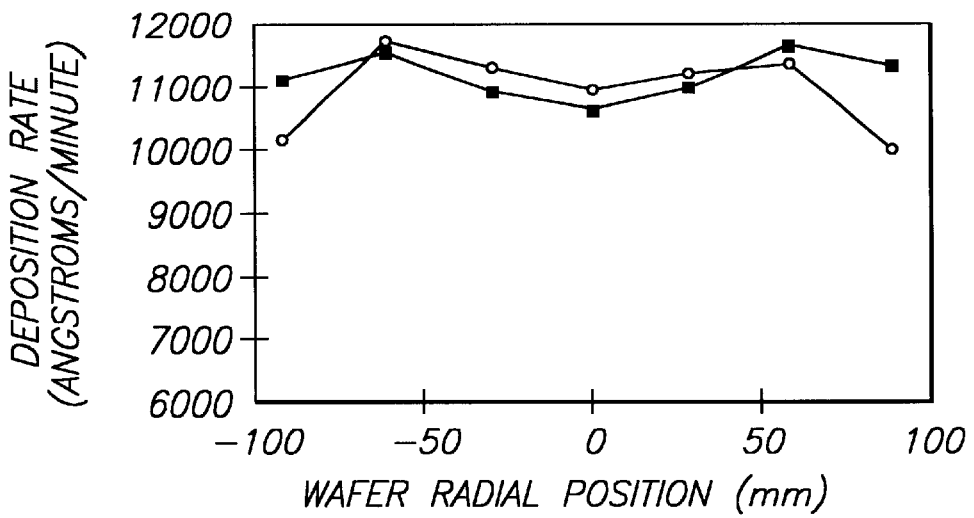
Figure 6:
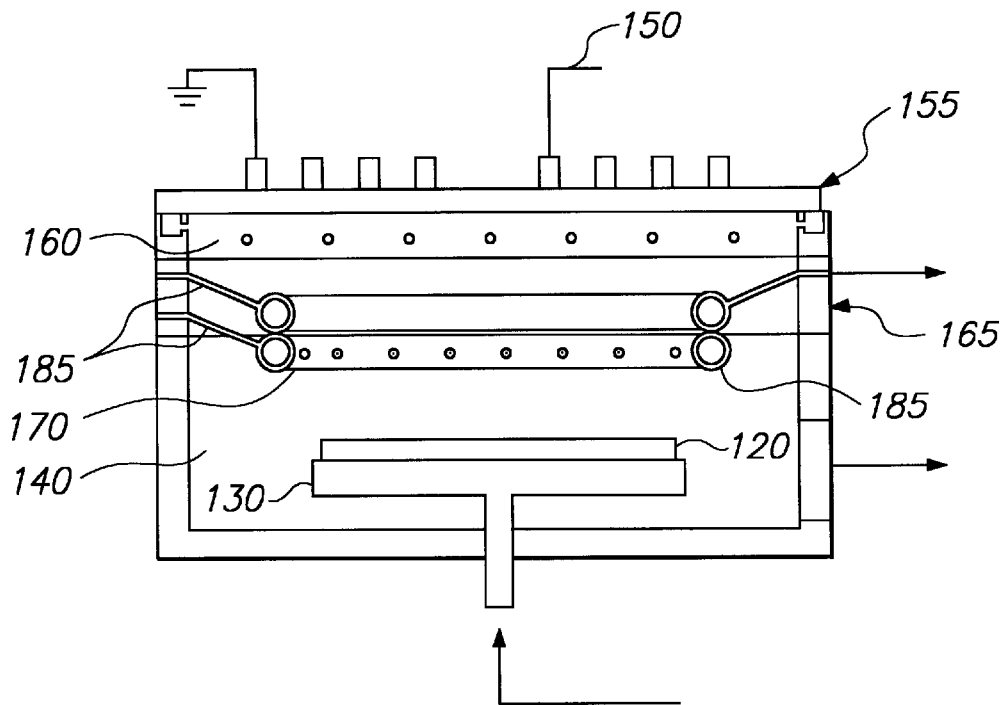
FIG. 6 illustrates a plasma processing system according to a second embodiment of the present invention.
Figure 7:
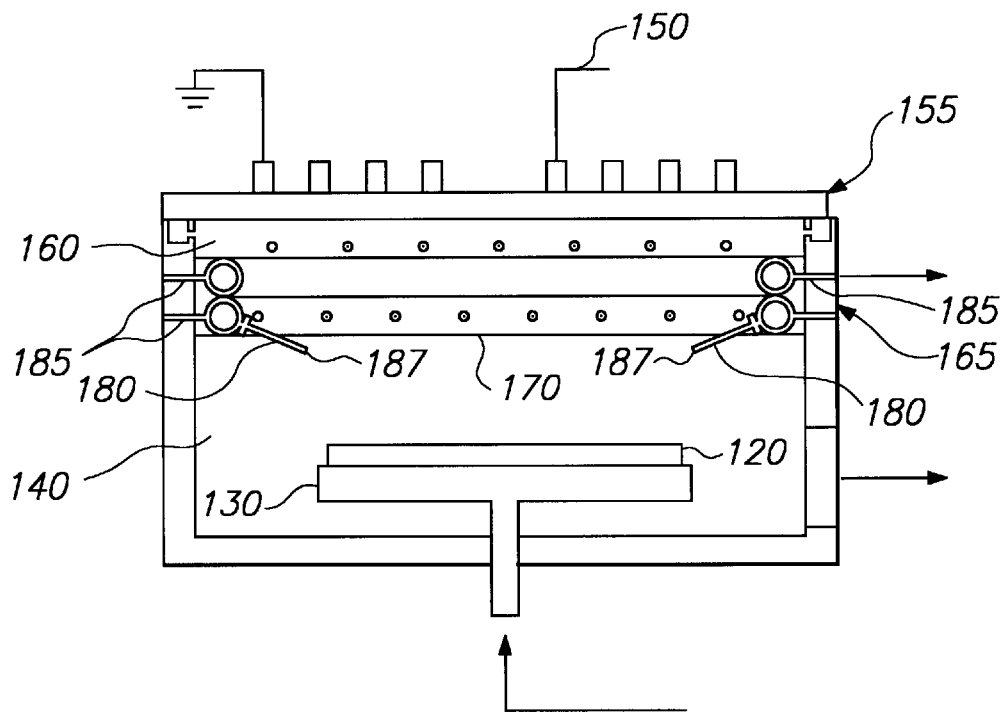
FIG. 7 illustrates a plasma processing system according to a third embodiment of the present invention.

FIG. 3b shows experimental data which illustrate the capability for optimizing the deposition rate and uniformity of the plasma processing system according to the present invention by selecting the appropriate angle of injection for a given injection location. Both cases illustrated in FIG. 3b were obtained at the same conditions (plasma source power= 2500 Watts, electrode bias power=2000 W, $SiH_4$ flow=250 sccm, $O_2$ flow=350 sccm, pressure=14 mTorr) with identical injection locations (16 injectors, equally spaced circumferentially, approximately 2 centimeters outside of and approximately 6 centimeters above the substrate), using gas ring 170. In case 3, (open circles) the angle of injection was 0 degrees (parallel to the substrate), while in case 4 (solid squares) the angle of injection was 30 degrees downward (toward the substrate). For case 3, the deposition rate was 10800 Angstroms/minute, while the uniformity was 5.3%, with the deposition rate lower near the substrate periphery. Similar to the results shown in FIG. 3b, the uniformity of case 3 could be improved by moving the injection location more outside of the substrate. This, however, would also result in a substantially decreased deposition rate (in FIG. 3a, the uniformity was approximately doubled, but with a 15% loss in deposition rate). By adjusting the injection angle to 30 degrees downward, as in case 4, the deposition onto the outer region of the substrate is increased, and the uniformity is improved to 2.5% while maintaining approximately the same overall deposition rate.

This example has demonstrated an unexpected result provided by the plasma processing system according to the present invention of improved deposition uniformity without a loss in deposition rate. This can be used to great advantage to increase the substrate throughput during semiconductor processing.

The plasma processing system according to this embodiment provides uniform, directed, rather than diffusive, flux of $SiH_4$ onto a substrate under typical HDPCVD conditions. Accordingly, consistent deposition uniformities with $1\sigma<3\%$ are produced in most cases. This is accomplished by carefully superposing the individual injector sprays so that the sum of the injector fluxes at each point on the substrate are nearly equal.

The theoretical basis for increasing the deposition rate near the substrate periphery without significantly reducing the rate near the center of the substrate can be understood from the following discussion. Typically, free jet expansion from sonic nozzles occur in the continuum flow limit, which results in restricted expansion due to the formation of a barrel shock/Mach disk structure. With such restricted expansions, one would not expect to be able to achieve a uniform flux distribution over the substrate, with a relatively small number of injectors. According to the present invention, however, the density of the jet and the chamber ambient are so low that the jet rapidly transitions to the free molecular flow regime.

In the free molecular flow regime, the jet is so rarefied that a shock structure cannot be established, and the jet simply expands as a Prandtl-Meyer expansion, with an effectively frozen (constant) temperature and velocity. FIG. 4 illustrates exemplary flow streamlines of the gas jet from an injector. Referring to FIG. 4, in the expansion, the flow streamlines appear to radiate from a point source. The density decreases along each streamline in proportion to the inverse square of the distance from the source, and the variation of density from streamline to streamline (with polar angle Θ) is approximately independent of the polar coordinate R. Thus, for example, at an exemplary flow rate of 200 sccm $SiH_4$ from 16 injectors having 0.020 inch diameter orifices, a chamber pressure of 10 mTorr and a gas ring pressure of 3.9 Torr, the total included angle of the conical expansion is approximately 150 degrees. This expansion is less divergent and thus more collimated than the cosine distribution associated with a purely effusive flow.

The centerline density decreases as the square of the distance from the jet exit. That is, the local gas density ρ is given as:

$$\rho(R,\Theta=0)\alpha(\rho(R=0,\Theta=0))/R^2 \quad (1)$$

where R and Θ are polar coordinates centered at the jet exit, with Θ=0 defined as the jet axis. In addition, the density for such an expansion decreases with a $\cos^2\Theta$ dependence, that is:

$$\rho(R,\Theta)=\rho(R,0)\cos^2(\pi\Theta/2\phi) \quad (2)$$

where ϕ is an empirical constant which depends upon the specific heat ratio for the injected gas. For example, ϕ=1.66 for nitrogen. By combining equation 1 and equation 2 and realizing that the velocity is constant beyond a few jet diameters, the flux J is determined as a function of position within the expansion as:

$$J_{SiH4}(R,\Theta)=\text{constant}\cdot\rho(R,\Theta) \quad (3)$$

where $J_{SiH4}$ is the flux of $SiH_4$.

FIG. 5 illustrates qualitatively how a uniform $SiH_4$ flux may be directed onto the substrate. Referring to FIG. 5, assume the flux impinging on the substrate at a point A along a jet centerline is the desired flux. At an off-axis point, B, the radial distance from the axis to the jet is reduced while the streamline angle with respect to the jet centerline is increased. The flux dependence on R and Θ are therefore complementary, and result in a largely uniform flux. That is, the decreased radial distance acts to increase the jet flux, while the increased streamline angle Θ acts to decrease the flux. At an off-axis point C, both the radial position and the streamline angle are increased with respect to point A. This results in a reduced flux at the substrate center from this injector, but this can be compensated for by overlapping spray cones from the other, e.g., 15, injectors around the periphery of the substrate. Similar observations can be made for other points on the substrate. The uniformity is further enhanced because of the large conical expansion of each jet.

The simple analysis above has neglected gas phase collisions. With a mean free path on the order of 1 cm, several gas phase collisions may be expected to occur prior to the $SiH_4$ molecules reaching the substrate. These collisions act to scatter the directed flux of $SiH_4$ somewhat, but the jets still maintain a far more directed nature than a purely diffusional source. It is this directional rather than diffusive nature of the plasma processing system according to the present invention that leads to the locally enhanced deposition rate.

FIG. 6 illustrates a plasma processing system according to a second embodiment of the present invention. The plasma processing system illustrated in FIG. 6 is similar to that shown in FIG. 2*a*, except that the primary ring 170 in FIG. 6 is cantilevered and water-cooled. According to this embodiment, reactant gas is delivered through orifices in the gas ring 170 which may be oriented in any direction. Preferably, some of the orifices are directed towards the substrate to enhance the deposition rate.

The water cooling of the gas ring 170 may be accomplished by using two independent welded tubes 185 as shown in FIG. 6 or by using a dual tube structure. Alternatively, a water cooling tube (not shown) may be spirally wrapped around the gas ring 170. The water cooling provides thermal control to minimize flaking from the gas ring and also prevents excessive heating of the gas ring due to high density plasma exposure.

Additionally, radiative cooling may be used to limit the chamber wall and gas ring temperatures and prevents thermal decomposition.

FIG. 7 illustrates a plasma processing system according to a third embodiment of the present invention. Referring to FIG. 7, the plasma processing system may include a cantilevered water-cooled gas ring 170 and injectors 180. The gas ring 170 may also be supported from the chamber floor.

According to this embodiment, reactant gases may be injected toward the substrate in the same manner as described above with regard to the first embodiment. Radiative cooling may be used to limit the chamber wall and gas ring temperatures. Additionally, the lower gas ring may be water-cooled as described above with regard to the second embodiment. Thus, the third embodiment provides uniform, directed deposition onto a substrate as well as thermal control of the gas injection hardware to minimize flaking.

FIGS. 8*a*–8*d* illustrate detailed views of exemplary injectors in a plasma processing system according to the present invention. For simplicity of illustration, some elements of the plasma processing system, such as the antenna 150 and the gas rings 160 and 170, are not shown. FIGS. 8*a* and 8*c* depict examples of orientations of the injector 180 with respect to the substrate 120. FIG. 8*a* shows the injector 180 oriented approximately 45 degrees from the horizontal plane of the substrate 120. FIG. 8*c* shows an alternative but less optimal orientation of the injector 180 at 90 degrees from the horizontal plane of the substrate 120. Although not shown, preferably the axis of injection (i.e., gas flow direction) is 15 to 45 degrees from the horizontal plane of the substrate 120.

Figure 8A:
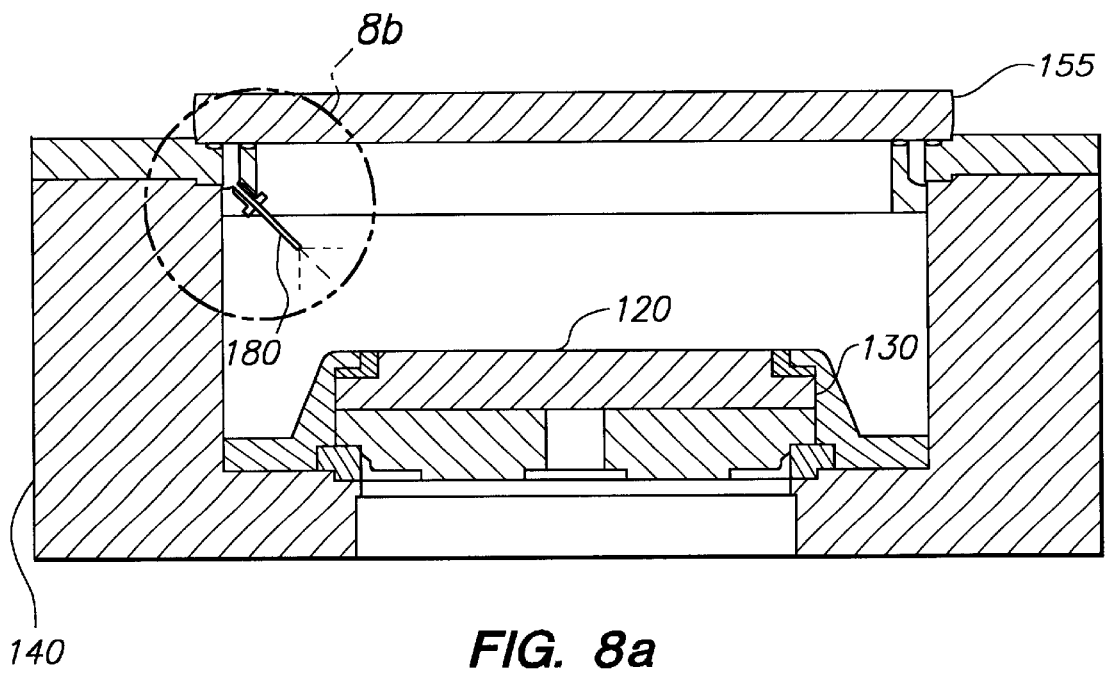
FIGS. 8a–8d illustrate detailed views of exemplary injectors in a plasma processing system according to the present invention.
Figure 8B:
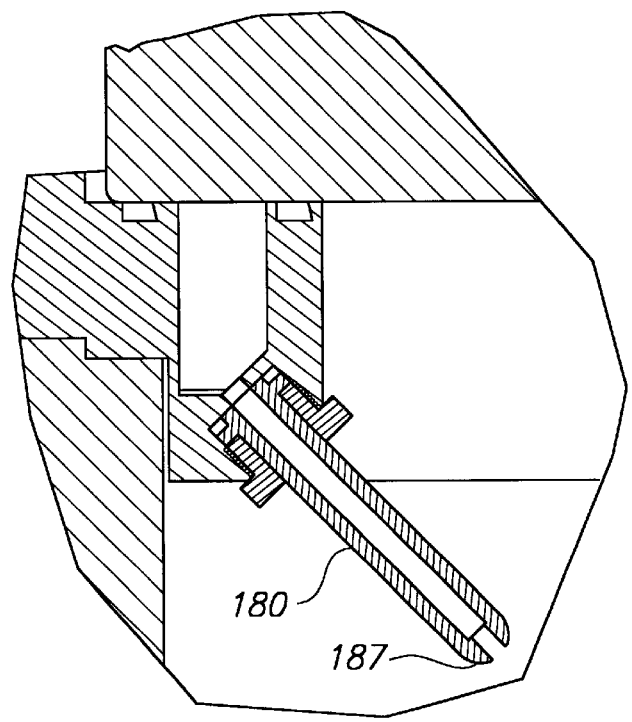
Figure 8C:
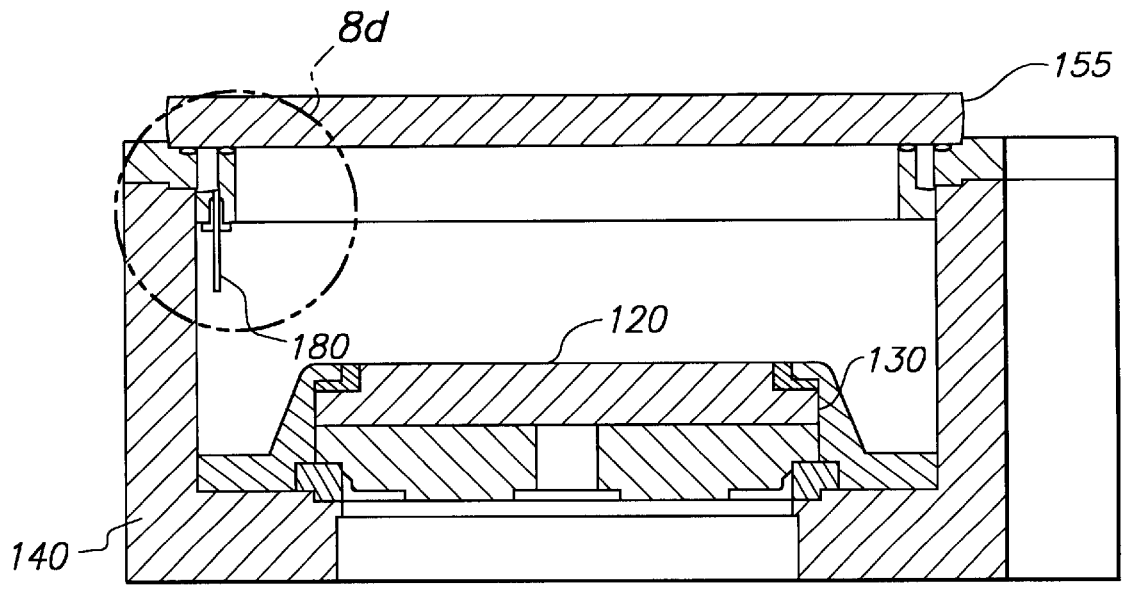
Figure 8D:
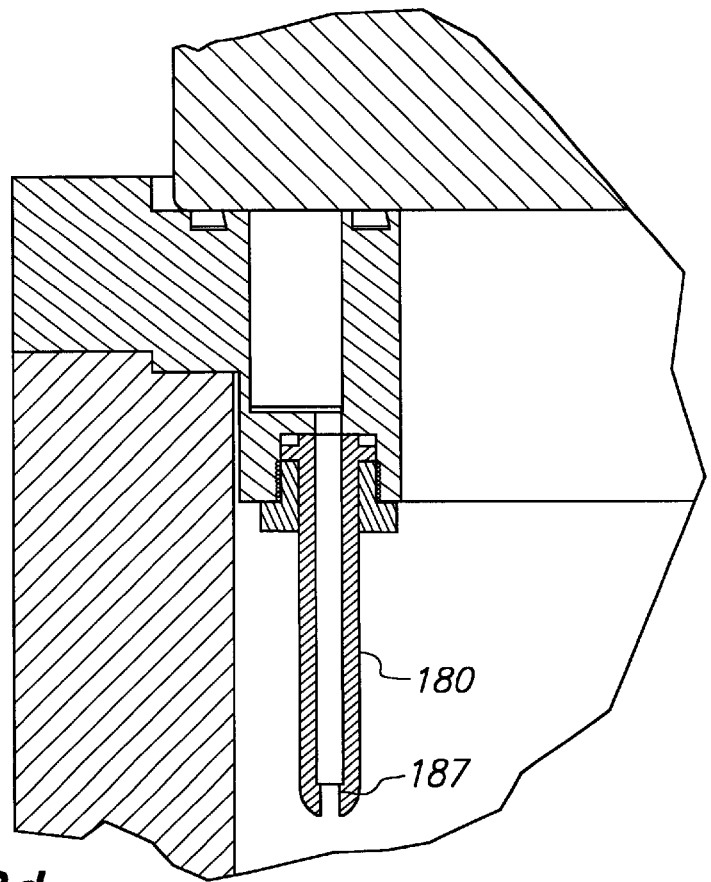

FIGS. 8a and 8b illustrate in detail the injector 180 shown in FIGS. 8a and 8c, respectively. As illustrated in FIGS. 8b and 8d, the core of the injector is larger than the diameter of the exit orifice 187 of the injector. This ensures that sonic flow occurs at the exit orifice and not within the core of the injector.

Figure 9A:
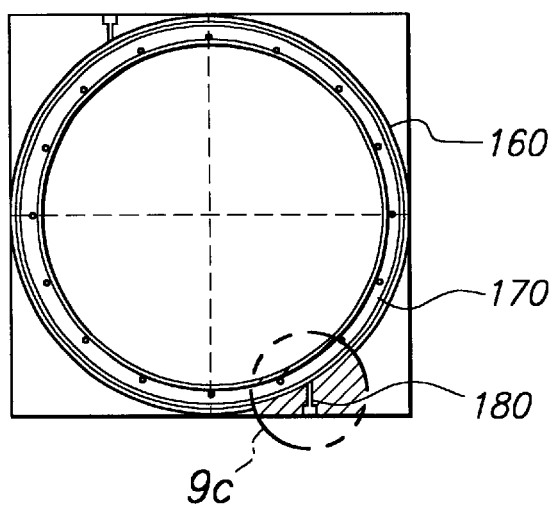
Figure 9B:
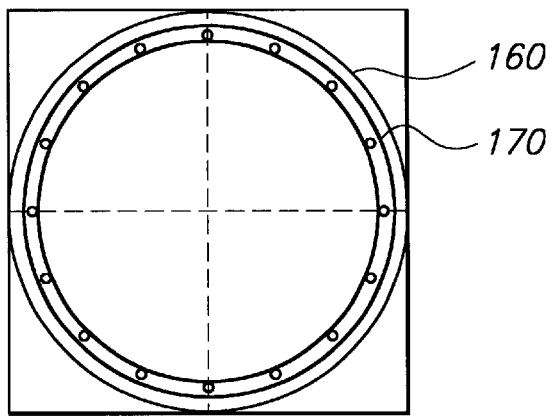
Figure 9C:
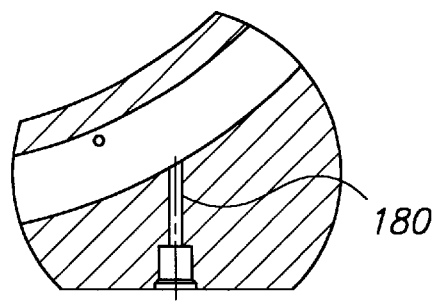

FIGS. 9a–9c and 10a–10c illustrate detailed views of exemplary injectors and gas rings according to the present invention. FIG. 9a illustrates a top view of the gas rings 160 and 170 and the injector 180. FIG. 9b illustrates a bottom view of the gas rings 160 and 170 and the injector 180. FIG. 9c illustrates a detailed top view of the injector 180.

Figure 10A:
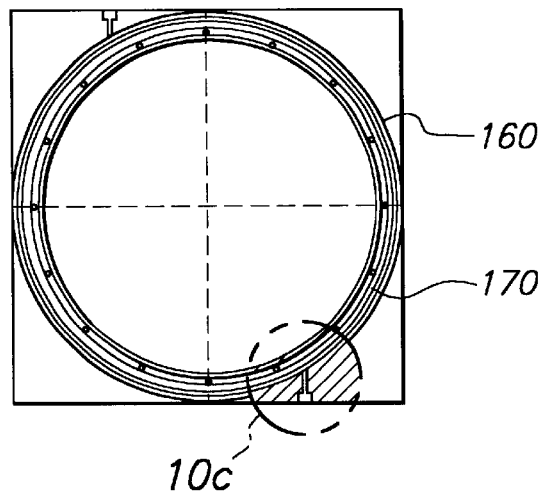

Similarly, FIGS. 10a and 10b illustrate a top view and a bottom view, respectively, of the gas rings 160 and 170 and the injector 180. FIG. 10c illustrates a detailed top view of the injector 180. FIGS. 10a, 10b and 10c are similar to FIGS. 9a, 9b, and 9c, respectively, except that the shapes of the gas outlets on the lower gas ring 170 are different.

FIG. 11 illustrates a detailed view of an exemplary injector according to the present invention. FIG. 11 shows exemplary dimensions of an injector 180 that may, for example, be in units of inches. As shown in FIG. 11, the angle of injection from the exit orifice 187 with respect to the injection axis may range from 0 to 90 degrees. As in FIGS. 8b and 8d, it is apparent from FIG. 11 that the core of the injector 180 is larger than the diameter of the exit orifice 187 of the injector.

This ensures that sonic flow occurs at the exit orifice and not within the core of the injector. The exemplary dimensions of an injector 180 are shown in FIG. 9 for purposes of illustration. The injector according to the present invention is not, however, limited to these dimensions. The dimensions may be selected as desired to be any amount, depending on the application.

While the foregoing gas injection system has been described with reference to a high density plasma CVD system, it could be used for other processes such as etching. It may, for example, be used for plasma etching in semiconductor applications which are predominantly chemical etching systems, such as chlorine etching of aluminum.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of depositing a layer of on a substrate comprising:

placing a substrate on a substrate holder in a processing chamber, wherein an interior surface of a dielectric member forming a wall of the process chamber faces the substrate holder;

supplying process gas into the processing chamber from a gas supply including a plurality of injectors having orifices, at least some of the orifices being in close proximity to the substrate and orienting the process gas along an axis of injection which intersects an exposed surface of the substrate at an acute angle such that a plurality of gas flows overlap each other in a plane parallel to the exposed surface of the substrate, the injectors injecting more of the process gas at the periphery of the substrate than in the middle of the substrate; and energizing the process gas into the plasma state by inductively coupling RF energy through the dielectric member into the processing chamber, the process gas being plasma phase reacted with the exposed surface of the substrate such that a layer of material is deposited on the exposed surface.

2. The method of claim 1, wherein said step of supplying a gas comprises the steps of:

supplying a gas or gas mixture from a primary gas ring located inside the processing chamber, wherein at least some of said gas or gas mixture passes through said injectors and is directed toward said substrate.

3. The method of claim 2, wherein said step of applying a gas further comprises the steps of:

supplying an additional gas or gas mixture from a secondary gas ring.

4. The method of claim 3, wherein the process gas supplied through the injectors is $SiH_4$ and the process gas supplied from the secondary gas ring comprises argon and oxygen.

5. The method of claim 2, wherein the injectors are connected to said primary gas ring, the injectors injecting at least some of said gas or gas mixture into said chamber and directed toward said substrate.

6. The method of claim 5, wherein the injectors are located near or outside of the substrate periphery.

7. The method of claim 2, wherein said injectors inject at least some of said gas or gas mixture into said chamber at an angle over 15 degrees with respect to the exposed surface of said substrate.

8. The method of claim 2, wherein said primary gas ring is cantilevered, and the method further comprises a step of cooling the primary gas ring during processing.

9. The method of claim 8, wherein said step of cooling comprises passing an electrically non-conductive cooling liquid in heat transfer contact with the primary gas ring to prevent excessive heating of the primary gas ring during processing of the substrate.

10. The method of claim 8, wherein the primary gas ring is cooled sufficiently to maintain a temperature thereof below 100° C.

11. The method of claim 2, wherein the primary gas ring is electrically grounded.

12. The method of claim 1, wherein the process gas is energized by an RF antenna in the form of a planar coil.

13. The method of claim 12, wherein the layer of material deposited on the substrate comprises a silicon-containing layer.

14. The method of claim 1, wherein the process gas is energized by an RF antenna in the form of a non-planar coil.

15. The method of claim 1, wherein substrates are consecutively processed in the processing chamber by contacting the substrates with the plasma gas.

16. The method of claim 1, wherein some of the orifices supply the process gas in a direction which does not intersect the exposed surface of the substrate.

17. The method of claim 16, wherein the gas supply further includes a gas distribution member located adjacent the dielectric member, and the orifices are located between the gas distribution member and the substrate holder.

18. The method of claim 1, wherein the orifices are located between an inductive plasma generation region in the plasma processing chamber and the exposed surface of the substrate.

19. The method of claim 1, wherein the layer of material deposited on the exposed surface comprises $SiO_2$.

20. The method of claim 1, wherein the substrate comprises a 12 inch semiconductor wafer.

21. The method of claim 1, wherein the interior of the processing chamber is at a pressure of 1 to 100 mTorr.

22. The method of claim 1, wherein the process gas is supplied through the injectors is $SiH_4$.

23. The method of claim 1, wherein the substrate holder applied an RF bias to the substrate.

24. The method of claim 1, wherein the layer of materials is deposited at a rate of at least 9000 Å/minute.

25. The method of claim 1, wherein the orifices of the injectors are sized such that sonic flow of the process gas occurs at the orifices of the injectors.

* * * * *